(12) United States Patent
Parchment et al.

(10) Patent No.: US 11,634,214 B1
(45) Date of Patent: Apr. 25, 2023

(54) DRONES WITH SENSORS USED IN INSURANCE APPLICATIONS

(71) Applicant: Liberty Mutual Insurance Company, Boston, MA (US)

(72) Inventors: David Antony Parchment, Boston, MA (US); Khamla Saenglongma, Boston, MA (US); Jeffrey Alan Wright, Boston, MA (US); Robert William Moore, Boston, MA (US); Jeffrey C. Mastendino, Boston, MA (US); Jeffrey Hoffman Marple, Jr., Boston, MA (US); Brendan William Smyth, Boston, MA (US)

(73) Assignee: LIBERTY MUTUAL INSURANCE COMPANY, Boston, MA (US)

( * ) Notice: Subject to any disclaimer, the term of this patent is extended or adjusted under 35 U.S.C. 154(b) by 914 days.

(21) Appl. No.: 16/409,374

(22) Filed: May 10, 2019

Related U.S. Application Data (62) Division of application No. 15/002,103, filed on Jan. 20, 2016, now abandoned.

(Continued)

(51) Int. Cl.
| | |
|---|---|
| *B64C 27/00* | (2006.01) |
| *H03H 9/205* | (2006.01) |
| *B64C 25/32* | (2006.01) |
| *B64D 43/00* | (2006.01) |
| *H03H 9/17* | (2006.01) |

(Continued)

(52) U.S. Cl.
CPC .............. *B64C 27/00* (2013.01); *B64C 25/32* (2013.01); *B64C 39/024* (2013.01); *B64D 43/00* (2013.01); *G05D 3/00* (2013.01); *H03H 9/17* (2013.01); *H03H 9/205* (2013.01); *B64C 2201/108* (2013.01); *B64C 2201/12* (2013.01);

(Continued)

(58) Field of Classification Search
CPC ....... B64C 27/00; B64C 25/32; B64C 39/024; B64C 2201/108; B64C 2201/12; B64C 2201/141; B64C 2201/146; B64D 43/00; G05D 3/00; H03H 9/17; H03H 9/205; G01H 1/00
See application file for complete search history.

(56) References Cited

U.S. PATENT DOCUMENTS

| | | |
|---|---|---|
| 3,601,342 A | 8/1971 | Piasecki et al. |
| 5,954,169 A | 9/1999 | Jensen |

(Continued)

OTHER PUBLICATIONS

Matthew Rocco, "USAA Eyes Drones to Fast-Track Insurance Claims," Fox Businesss, Oct. 8, 2014, 7 pages.

(Continued)

*Primary Examiner* — Brian P Sweeney
(74) *Attorney, Agent, or Firm* — Alston & Bird LLP (57) ABSTRACT

Drones are engineered with sensors for use in insurance applications. After locating an object of interest, a drone performs an investigation by probing the object of interest. Sensors receive feedback from the object of interest. An electronic fingerprint of the drone is produced. Afterward, perils are computed based on the feedback and the fingerprint of the drone is used in insuring the object of interest. The act of probing includes thumping, drumming, or radiating ultrasound waves against the object of interest. The sensors can be turned off when they are within a geographic zone of prohibited operations.

19 Claims, 12 Drawing Sheets

Related U.S. Application Data (60) Provisional application No. 62/107,167, filed on Jan. 23, 2015.

(51) Int. Cl.
  *B64C 39/02* (2006.01)
  *G05D 3/00* (2006.01)
  *G01H 1/00* (2006.01)

(52) U.S. Cl.
  CPC .. *B64C 2201/141* (2013.01); *B64C 2201/146* (2013.01); *G01H 1/00* (2013.01)

(56) References Cited

U.S. PATENT DOCUMENTS

| | | |
|---|---|---|
| 8,229,768 B1 | 7/2012 | Hopkins, III |
| 8,731,234 B1 | 5/2014 | Ciarcia et al. |
| 9,527,588 B1 * | 12/2016 | Rollefstad ............. B64C 39/024 |
| 2008/0262789 A1 | 10/2008 | Pershing et al. |
| 2009/0265193 A1 | 10/2009 | Collins et al. |
| 2009/0279734 A1 | 11/2009 | Brown |
| 2010/0110074 A1 | 5/2010 | Pershing |
| 2012/0136630 A1 * | 5/2012 | Murphy ................. F03D 17/00 702/188 |
| 2013/0202157 A1 | 8/2013 | Pershing |
| 2014/0019166 A1 | 1/2014 | Swanson et al. |
| 2014/0091966 A1 | 1/2014 | Swanson et al. |
| 2014/0212026 A1 | 7/2014 | Ciarcia |
| 2014/0244695 A1 | 8/2014 | Battcher et al. |
| 2014/0257595 A1 | 9/2014 | Tillmann |
| 2014/0316614 A1 | 10/2014 | Newman |
| 2014/0374532 A1 | 12/2014 | Duffy et al. |
| 2015/0019267 A1 | 1/2015 | Prieto et al. |
| 2016/0063642 A1 * | 3/2016 | Luciani ................. G06Q 40/08 705/4 |

OTHER PUBLICATIONS

Luciani, et al., "Use of Drones to Assist With Insurance, Financial and Underwriting Related Activities," U.S. Appl. No. 62/044,709, filed Sep. 2, 2014, 12 pages.

Johnson, "The Future of Drones in the Insurance Industry," Insurance Journal, Mar. 7, 2014, 6 pages.

"Property Drone Consortium," EagleView Technologies, Inc., Dec. 3, 2014, 5 pages.

"Drones for Insurance Claims Investigation," Precision Drone®, at least as early as Feb. 12, 2015, 3 pages.

* cited by examiner

DRONES WITH SENSORS USED IN INSURANCE APPLICATIONS

CROSS-REFERENCE TO RELATED APPLICATION

This application is a divisional of U.S. application Ser. No. 15/002,103, filed Jan. 20, 2016, which application further claims priority to and the benefit of U.S. Provisional Patent Application No. 62/107,167, filed Jan. 23, 2015; the contents of both of which as are incorporated herein by reference in their entirety.

TECHNICAL FIELD

The present subject matter is generally related to drones, and more particularly, it relates to drones with engineered sensors for use in insurance applications.

BACKGROUND

A drone is an aircraft without an onboard human pilot. Drones can be autonomous or remotely piloted, the flight of either of which is controlled by onboard computers or by the remote control of a pilot on the ground or in a vehicle. There are many uses for drones, primarily military, but a small and growing number are used in civil applications, such as policing and firefighting, as well as non-military security work including inspection of power or pipelines.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter. One aspect of the present subject matter recites a drone which comprises a body; wings connected to a top of the body; propellers coupled to the wings; parallel sets of landing gear connected to a bottom of the body; an insulator structure interfaced to the bottom of the body which is set between the sets of landing gear; and a thumping structure coupled to the insulator structure.

Another aspect of the present subject matter recites another drone which comprises a body; wings connected to a top of the body; propellers coupled to the wings; parallel sets of landing gear connected to a bottom of the body; a slidable cylindrical structure coupled to the bottom of the body which is set between the sets of landing gear; and a piezoelectric transducer for emanating ultrasound waves directed toward an object of interest. A further aspect of the present subject matter recites a method which comprises landing a drone so that its landing gear contacts an object of interest; lengthening a rod through a set of hollow elements attached to the drone so that a terminus of the rod contacts the object of interest; causing the terminus of the rod to act against the object of interest; receiving by sensors some feedback from the object of interest; creating an electronic fingerprint of the drone; storing the feedback and the fingerprint of the drone in memory; and computing perils based on the feedback and the fingerprint of the drone used in insuring the object of interest.

DESCRIPTION OF THE DRAWINGS

The foregoing aspects and many of the attendant advantages of this invention will become more readily appreciated as the same become better understood by reference to 20 the following detailed description, when taken in conjunction with the accompanying drawings, wherein.

DETAILED DESCRIPTION

Figure 1:
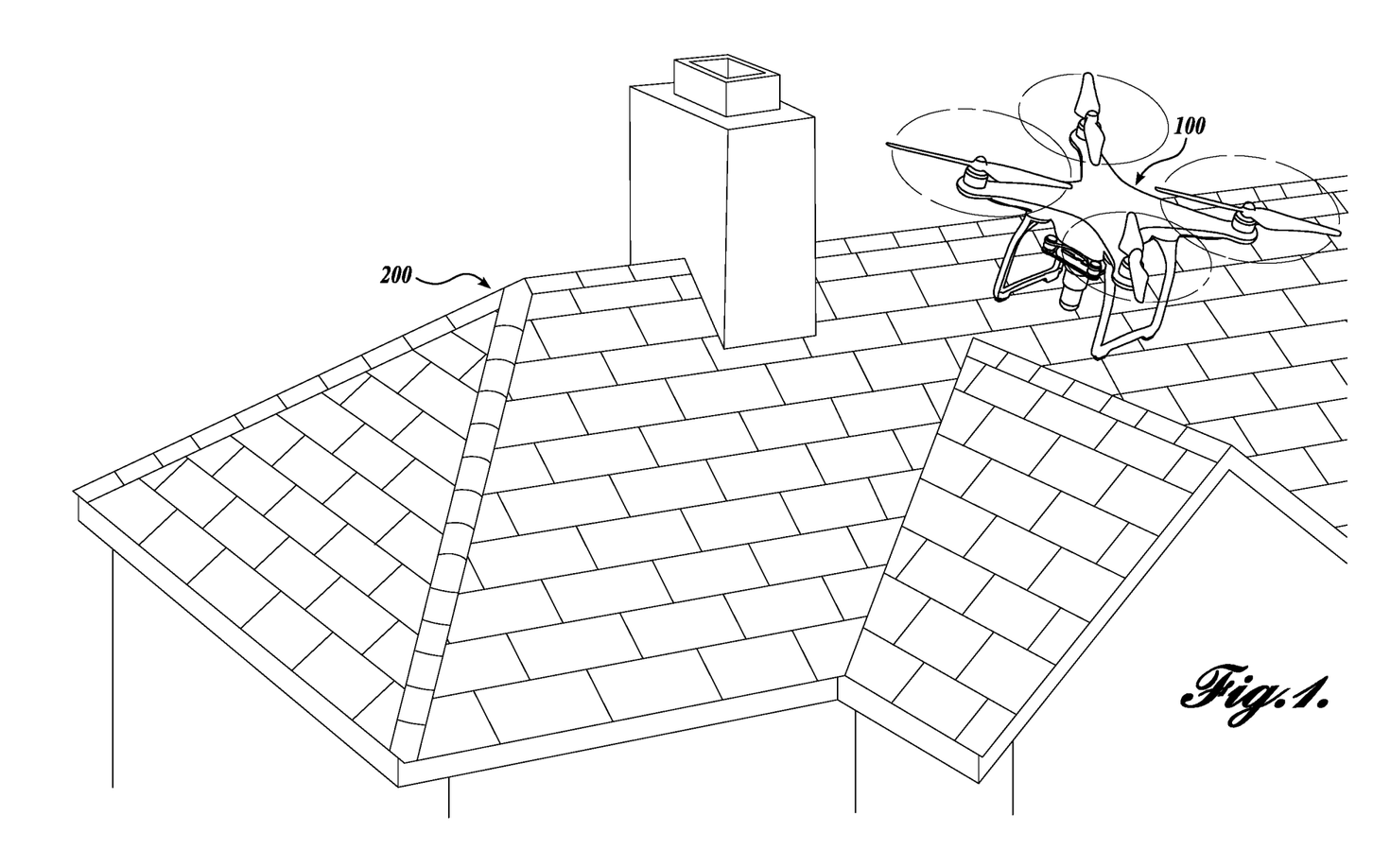
FIG. 1 is a diagram illustrating an environment in which an archetypical drone operates with hardware structures executing software and/or hardware logic blocks.

FIG. 1 illustrates operation of a drone 100 on an object of interest, such as a roof 200. Various archetypical drones including the drone 100 are engineered with sensors including digital cameras and/or thermal cameras, to sense the object of interest, in accordance with various embodiments. These sensors include heat sensors, ambient environment sensors (detecting light, moisture, temperature), sound sensors, air quality sensors, chemical sensors, roof sensors, infrared sensors, ultrasound sensors, MRI sensors, radar sensors, property sensors, biosensors (mold sensors, virus sensors including Ebola detectors), status sensors (voltage levels, cybersecurity level, and motion), liDar sensors (three-dimensional mapping and autonomous vehicle tracking), and so on. These sensors detect events or changes in quantities and provide a corresponding output, generally as an electrical or optical or audio signal. There are three categories of output for the drone 100 including directly transmitting sensor data; storing sensor data within the memory of the drone 100; and the drone 100 reacts or adapts based on hardware logic based on sensor data.

The sensors in a few embodiments use micro-machineries or microcontrollers to execute applications beyond temperature, pressure, or flow measurement. In one embodiment, analog sensors such as potentiometers and force-sensing resistors are used. A sensor's sensitivity indicates how much the sensor's output changes when the input quantity being measured changes. Not shown is a server being a part of a cloud network, which is communicatively coupled to the drone 100. The server associates the drone 100 to the object of interest so as to orchestrate hardware logic or software algorithm to sense the object of interest and to compute perils based on the sensed feedback. Some of the peril computations include x-ray fluorescent spectroscopy, ramen spectroscopy, and so on. FIG. 1 illustrates the drone 100 operating by itself, but in other embodiments a group of drones works together to perform tasks as orchestrated by the server, and in yet other embodiments each member of the group of drones performs different tasks but is functionally complimentary to the group of drones.

Drones with roof sensors, such as the drone 100, can land on the roof 200 with mechanical landing gear. The mechanical landing gear facilitates the drone 100 with roof sensors to traverse the roof 200 so as to thump the roof 200 or to drum the roof or to emit electromagnetic radiation or audio radiation of which the reflected feedback is sensed by the roof sensors. The data sensed by the roof sensors undergoes computational analytics to detect meaningful patterns to measure integrity of the roof structure or the overall structure or the mechanical components of the roof 200. The drone 100 with roof sensors can test different spots of the roof 200. A drone with infrared sensors can test roof components to determine the amount of heat that they could withstand for integrity analysis. For example, hail-damaged roofs may have a different amount of heat that they could withstand. A drone with infrared sensors can be used in an energy audit insurance application to detect the presence of insulation or whether and where a building envelope has been breached. A drone with property sensors has pattern recognition software running on a microprocessor so as to constrain to surveying a specific piece of property of interest in one embodiment, and in one other embodiment, the sensors are constrained so as to survey the neighboring pieces of property near the specific piece of property of interest. The property sensors have authentication software to ensure that the drone is surveying the specific piece of property of interest. In all embodiments, the drones with sensors are engineered to operate only within the geographic zone of permitted operations. In other words, the sensors of the drones are turned off when it is within a geographic zone of prohibited operations.

The drones with sensors, such as the drone 100, are engineered to be electronically registered for identification, tracking, and management purposes. These drones have user interfaces to communicate intentions, namely, to send probe signals and receive feedback in insurance applications. These drones with sensors can be selected to deploy in insured construction projects to check safety (e.g., whether hard hats are being used); check construction progress; check whether suitable engineering construction quality is adhered to; and so on. These drones with sensors can be selected to deploy to measure physical shifts in landscape, taking unstructured pixels and structuring them. These drones with sensors can be selected to deploy in disaster recovery or for operation as just-in-time suppliers; and in such an embodiment, the drone 100 is fitted with means for delivering a payload, such as mechanical claws. These drones with sensors can be selected to deploy internationally to monitor traffic in and out of a port; hours of port operation; quantity of containers; and port facilities. These drones with sensors can be selected to deploy to insure amusement parks. These drones with sensors can be selected for deployment to survey crops, combining crop data, economic data, and meteorological data to analyze crop risk. These drones with sensors facilitate risk to be calculated not only for insureds but also risks of others. These drones with sensors can be selected for deployment in claims inspections of burned buildings, asbestos investigations, chemical spills, and so on. These drones with sensors can be selected for deployment to collect data so as to reconstruct an explosion scene, an automobile accident, a wildfire in progress, a spectral analysis of fire, and so on. These drones with sensors can be selected to deploy for home inspections and/or home repair applications.

These drones with sensors, including the drone 100, can be selected for deployment to assess risk in insuring airspace above a piece of property. These drones with sensors have identification technologies to introduce themselves to those whom they are flying over. These drones with sensors have intention technologies to alert others that they are flying overhead and then afterward leave drone fingerprints behind. In various embodiments, the fingerprints of a drone are queried data structures extracted from records within a database to facilitate a co-located chain of evidence within an image or video (including data types about an airframe of the drone, the aircraft, the pilot three-dimensional location data, and so on); data types that can be used to organize imagery; data types suitable for use in analysis and reporting of the imagery which is cross-referenced with aircraft and pilot information; and so on. In some embodiments, the queried data structures are in a suitable standard format for ease of communication among insurance carriers; businesses; insureds; vendor partners; pilots; operators; manufacturers; and so on. The queried data structures include the following fields: 5-Digit Exemption Number; COA Number; FAA Tailfin Number; Operator/Pilot License Number; Airframe Make; Airframe Model; Airframe Serial Number; Flight Navigational System Make; Flight Navigational Model; Flight Navigational Version; Flight Navigation Firmware Version; Altitude; Speed; Heading; Image Number Over Total Number of Images; and so on. In one embodiment, in addition to the described fields are the Exif Data generated by a digital camera. In another embodiment, these fields are embedded into each captured image as metadata. In all embodiments, the fingerprints of the drone are stored in the memory of the drone or on a server of a cloud network. In another embodiment, electronic fingerprints of the object comprising the sensed feedback received by the sensors on the drone are also stored in the memory of the drone or on a server of a cloud network.

These drones with sensors have secure technologies to operate in areas where they could facilitate a digital handshake. These drones with sensors have collision avoidance software. These drones with sensors collect data to augment or replace actuarial modeling. These drones with sensors can be selected for deployment to assess marine point liability including crane operation, movement of cargo, cars, and verification of data provided by insureds. These drones with sensors can be selected for deployment to high risk areas to gather data prior to the pricing of insurance policies. These drones with sensors can be selected for deployment to take a core sample of a roof. These drones with sensors can be selected for deployment to analyze vibration energy applied to a roof. These drones with sensors can be selected for deployment to detect mold. These drones with sensors can be selected for deployment to provide periodic check-ups of a roof. These drones with sensors can be selected for deployment to analyze the risk connected with drone operator certification by assessing the risk of operators of drones. These drones with sensors can be selected to analyze the risk of cybersecurity at a specific building by flying to the building; obtain permission from a server on a cloud network to gather network status data, WiFi security and other data that is indicative of cybersecurity risk; and sensing a location of hacking activities, such as in a parking lot in proximity to the building. These drones with sensors can be selected for deployment to emit radar to detect drones.

These drones with sensors can be selected for deployment to assess risk of a damaged building, facets of a roof to estimate damage or size, parapets, HVAC on top of buildings, chimneys, and other mechanical components in dangerous, hard to reach locations. These drones with sensors can be selected for deployment to assess risk connected with hard to reach property such as a feed shed on a farm, grain silo with no ladder, and so on. These drones with sensors can be selected for deployment to provide quick estimation of severity. These drones with sensors can be selected for deployment to triage claims and/or damage. These drones with sensors can be selected for deployment to assess logistical information, which is fluidly collected including information such as which roads are open, closed, the presence of emergency response, the presence of ongoing damage, and so on. These drones with sensors can be selected for deployment to provide reconnaissance of assets. These drones with sensors can be selected for deployment to assess risk to large assets including skyscrapers, bridges, farms, grain silos, cruise ships, aviation assets, railroad, power and energy structures, mines, and so on. These drones with sensors can be selected for deployment to reconstruct an accident scene involving vehicles. These drones with sensors can be selected for deployment to determine type of trees on an identified piece of property as well as their health.

Figure 2:
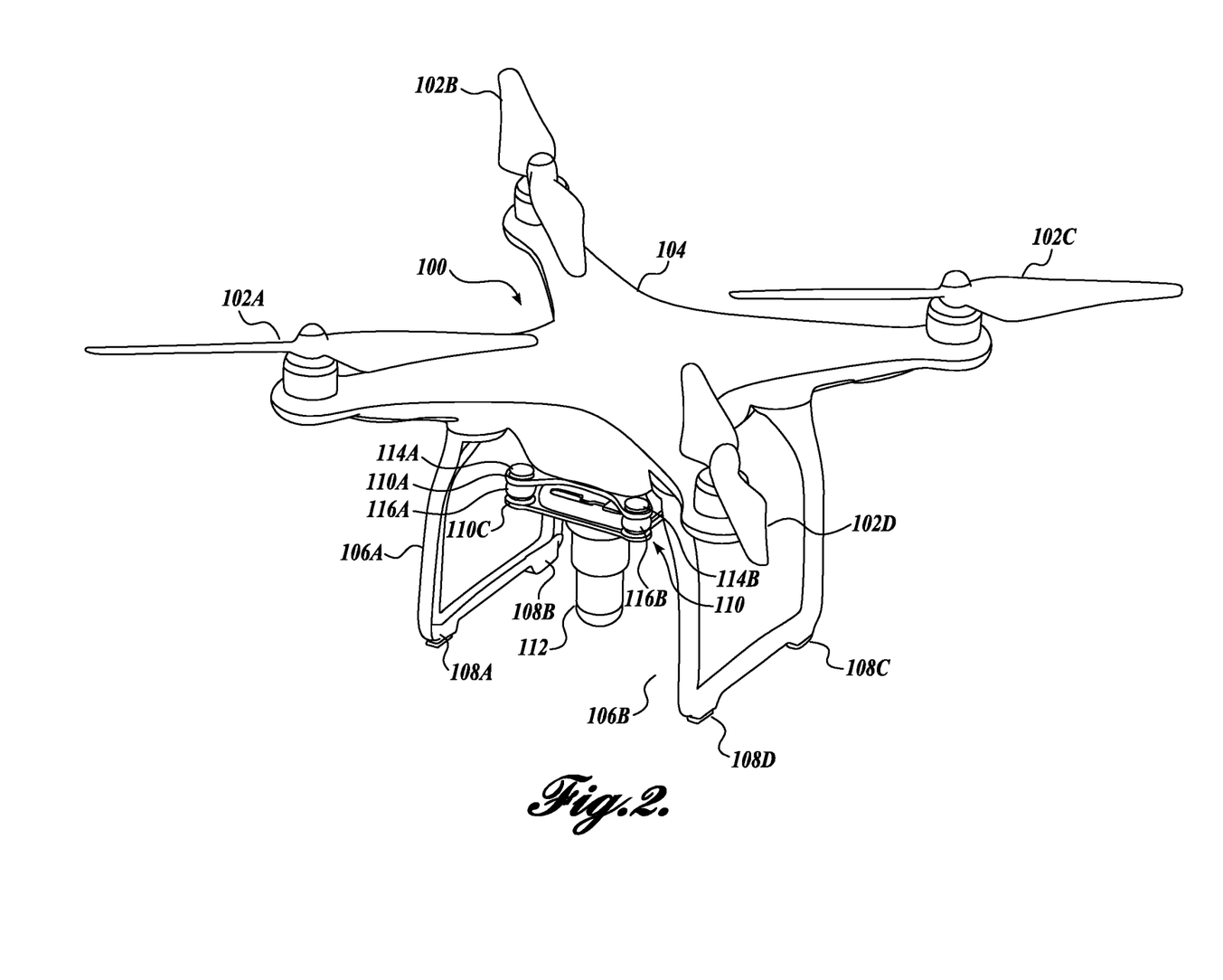
FIG. 2 is an isometric diagram illustrating a front of an archetypical drone.

FIGS. 2-7 illustrate several archetypical drones. Similar hardware elements contain identical nomenclature for brevity purposes. Not shown include drones that are a hybrid of quadcopter and fixed wing. FIG. 2 illustrates the drone 100. The drone 100 includes a body 104 extending from which are four wings and to which four propellers 102A-102D are attached. Supporting the body 104 so that the drone 100 is elevated from a landing are sets of landing gear 106A and 106B, whose height is suitably chosen so that a thumping structure 112 when lengthened may contact a surface of an object of interest, such as the roof 200. The landing gear 106A is coupled to skids 108A and 108B. The landing gear 106B is coupled to skids 108C and 108D. These skids 108A-108D are runners to prevent the drone 100 from skidding on landing. The bottom of the body 104 of the drone 100 is interfaced to an insulator structure 110. The insulator structure 110 is coupled to a thumping structure 112.

Figure 3:
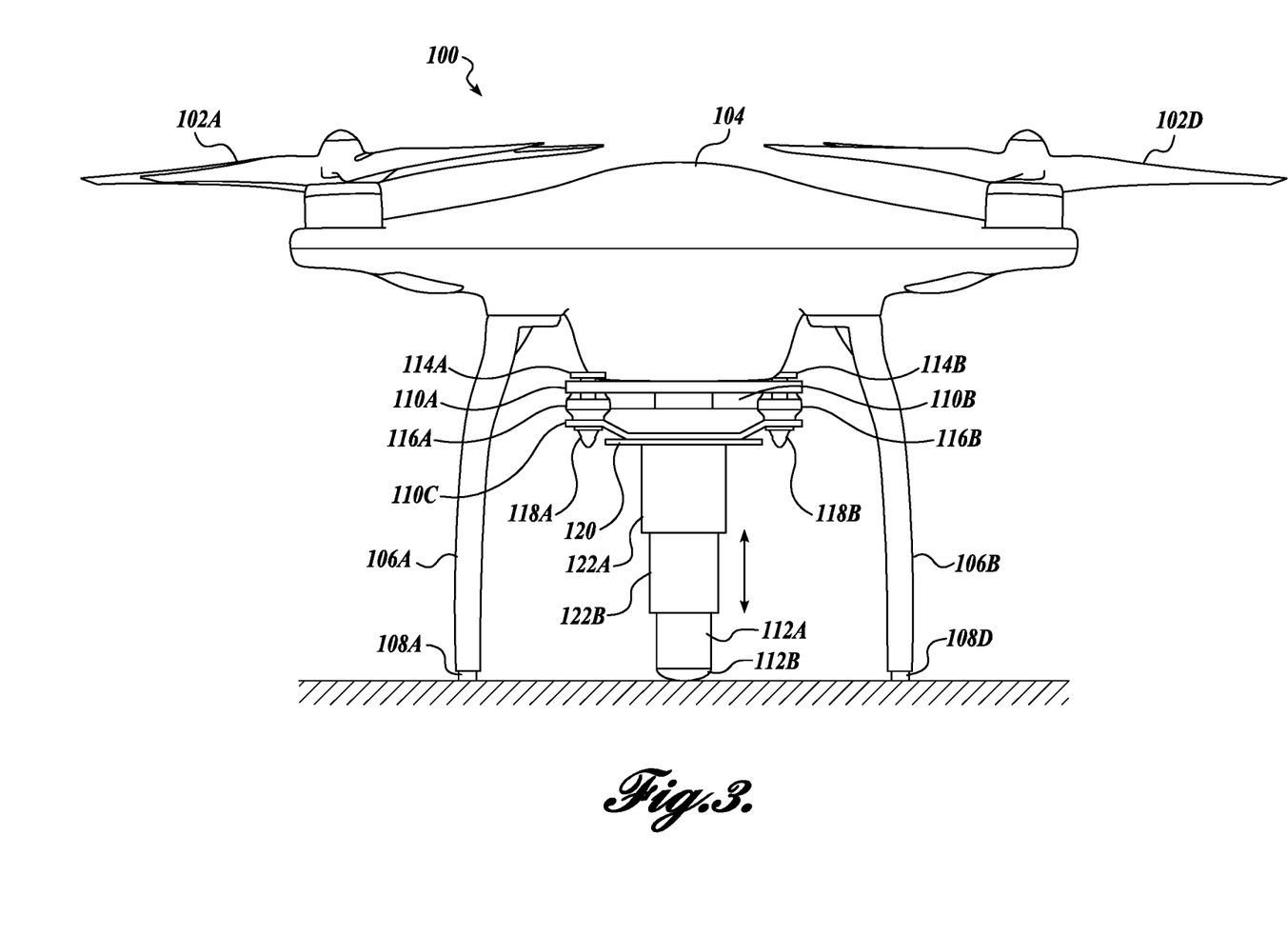
FIG. 3 is a planar diagram illustrating a front of an archetypical drone.
Figure 3A:
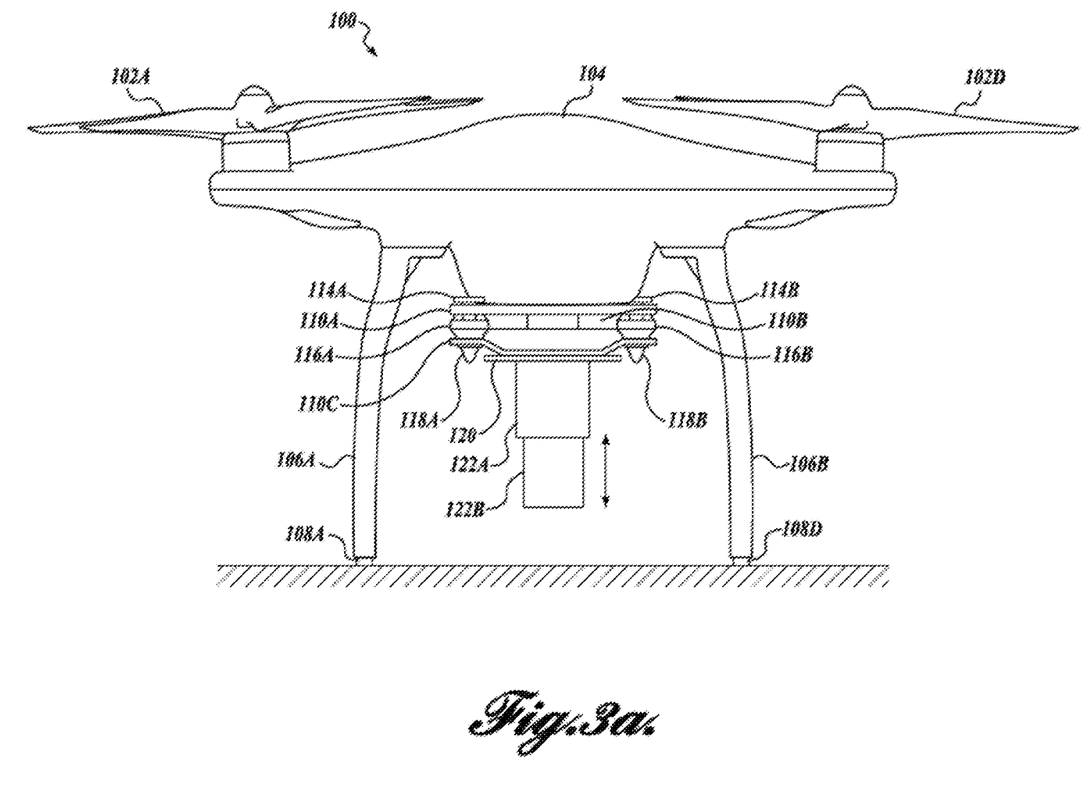
FIG. 3A is a cross-sectional diagram illustrating pieces of hardware connected with an archetypical thumping structure.
Figure 3B:
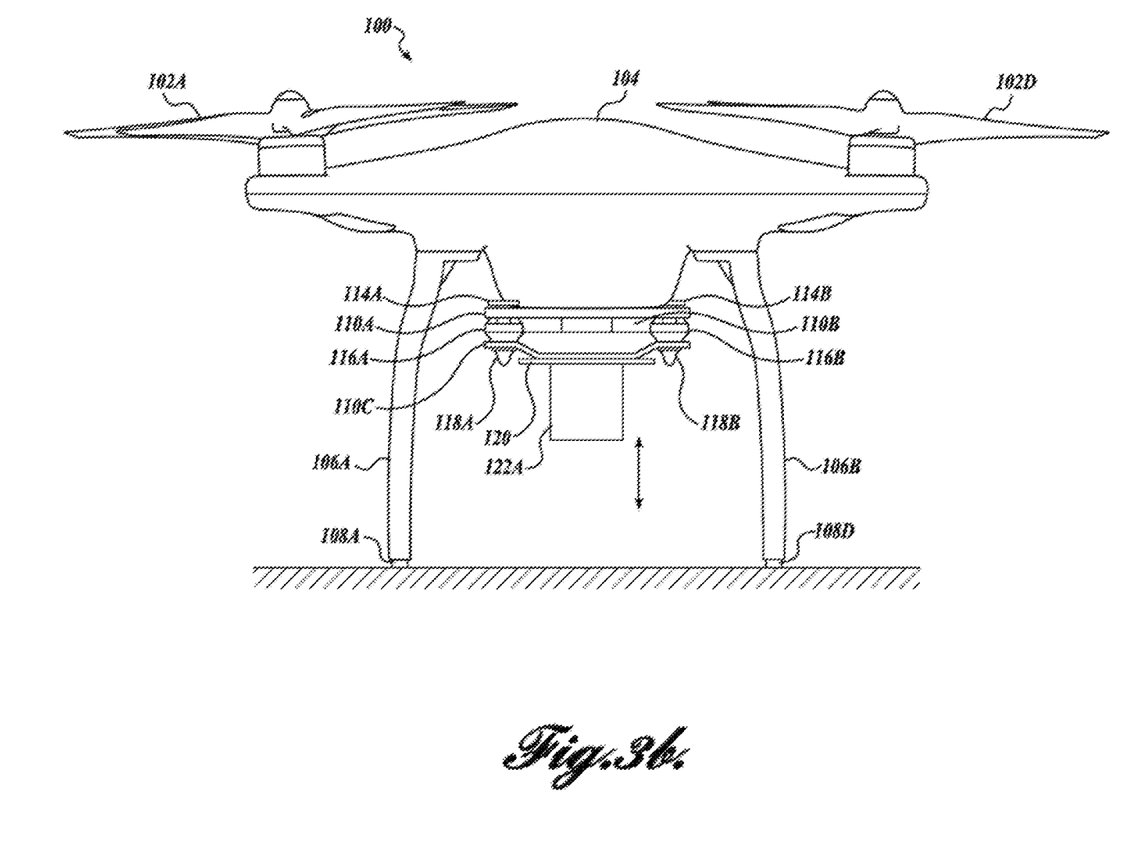
FIG. 3B is a cross-sectional diagram illustrating pieces of hardware connected with an archetypical thumping structure.
Figure 3C:
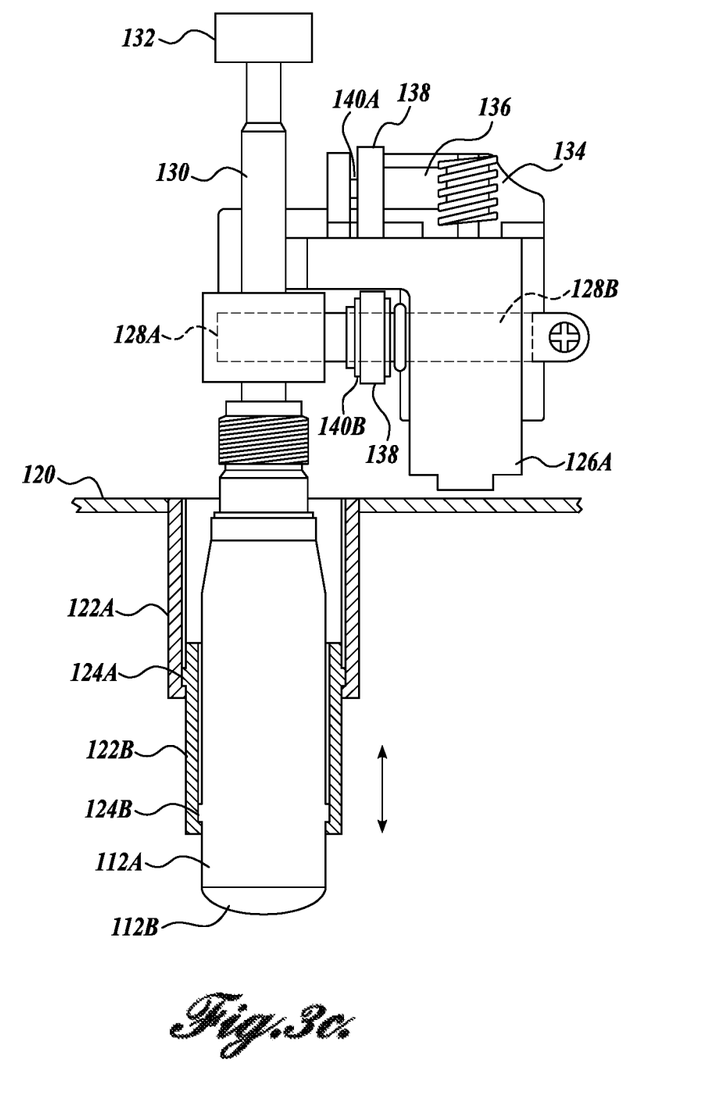
FIG. 3C is a cross-sectional diagram illustrating pieces of hardware connected with an archetypical thumping structure.
Figure 3D:
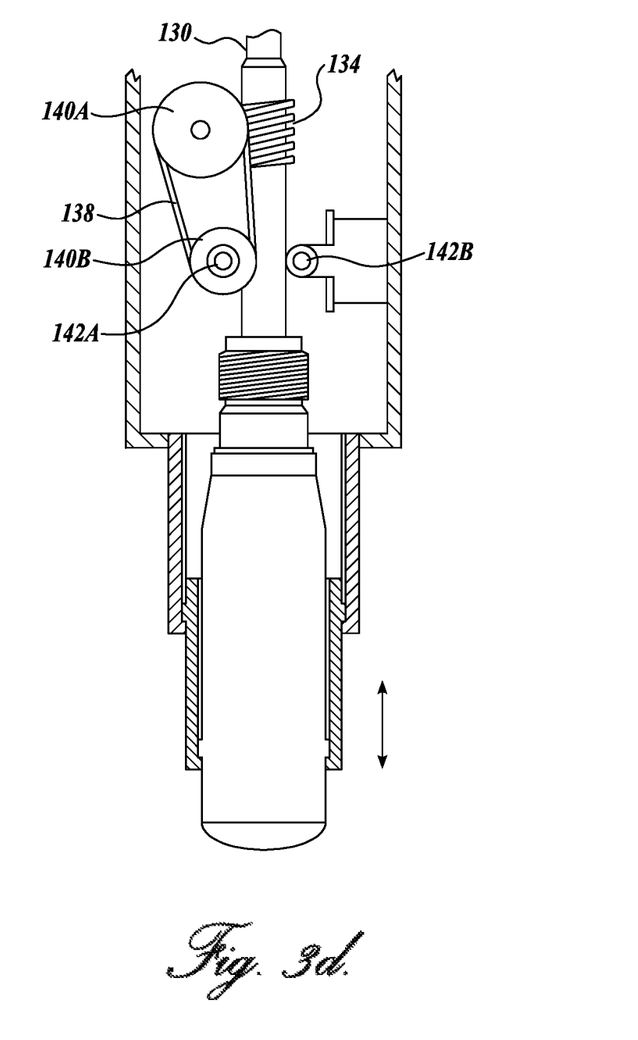
FIG. 3D is another cross-sectional diagram illustrating a side view of pieces of hardware connected with an archetypical thumping structure.
Figure 3E:
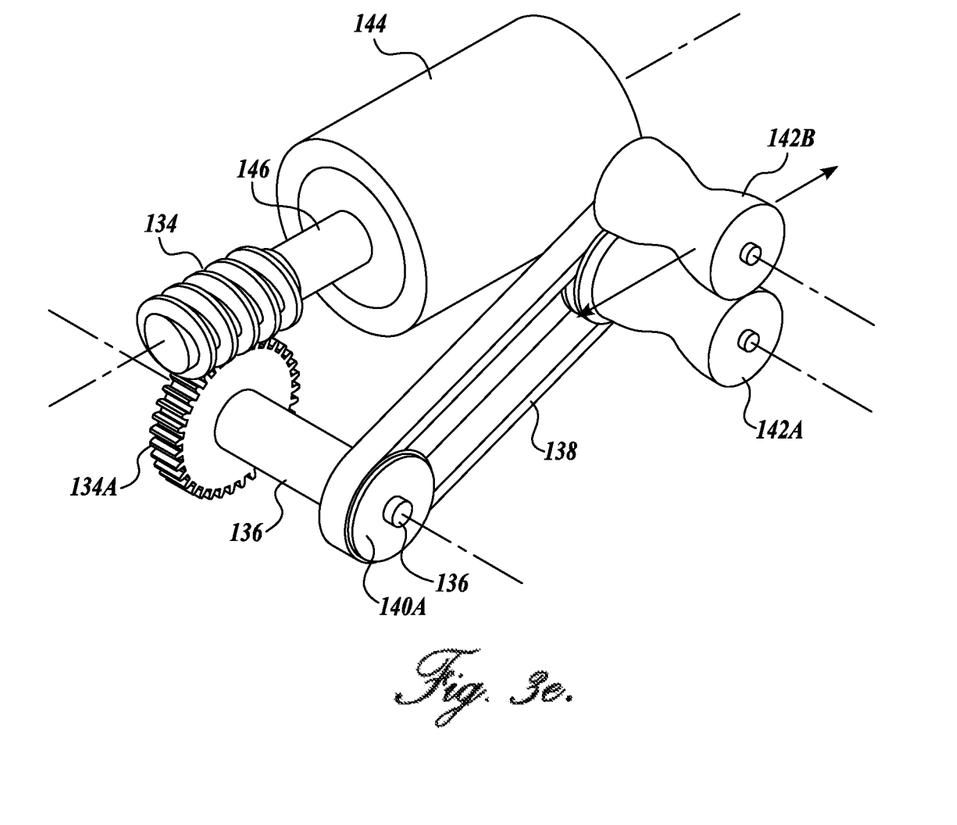
FIG. 3E is an isometric diagram illustrating pieces of hardware connected with a thumping structure.

Regarding FIG. 3, the insulator structure 110 includes three layers including an insulator layer 110A, an insulator layer 110B, and an insulator layer 110C. These insulator layers 110A-110C are fastened together by several O-shaped bolts 116A-116D. The O-shaped bolts 116A-116D hold the insulator layers 110A-110C together via nuts 114A-114D and lugs 118A-118D. The insulator layers 110A-110C isolate the drone 100 from a source of thumping, namely, the thumping structure 112, using passive isolation. Any suitable passive isolators may be used to manufacture the insulator layers 110A-110C including without limits elastomers; rubber; cork; dense foam; laminate materials; negative-stiffness isolators; wire rope isolators; base isolators; and tuned mass dampers.

The insulator structure 110 interfaces with an interfaced layer 120. The interfaced layer 120 acts as a supporting joint to the thumping structure 112. Emerging beyond the thumping structure 112 is a thumping body 112A. The thumping structure 112 is shown in a lengthened position in FIG. 3. The thumping body 112A lengthens from a thumping rod 130, through the set of elongated, rigid thumping hollow elements 122A-122B, and terminates in the C-shaped thumping terminus 112B. The thumping hollow elements 122A-122B include an outermost thumping hollow element 122A and an innermost thumping hollow element 122B. The outermost thumping hollow element 122A is secured to the interfaced layer 120. The set of elongated, rigid thumping hollow elements 122A-122B have aligned longitudinal axes and successively decreasing transverse dimensions to facilitate each of the thumping hollow elements 122A-122B to axially slide therebetween. The set of thumping hollow elements 122A-122B are also hollow to permit the thumping body 112A to pass through the inside of the set of thumping hollow elements 122A-122B. The outermost thumping hollow element 122A has the largest transverse dimension and is securable to the interface layer 120. The innermost thumping hollow element 122B has the smallest transverse dimension and is axially moveable relative to the outermost thumping hollow element 122A.

FIGS. 3A-3E illustrate the thumping structure 112 in greater detail. As discussed in previous figures, the interface layer 120 is provided to act as a supporting joint between the body 104 and the thumping structure 120. An annular keeper 124A on the outermost thumping hollow element 122A abuts an annular follower on the innermost thumping hollow element 122B to prevent the innermost thumping hollow element 122B from sliding away from the outermost thumping hollow element 122A when the thumping body 112A lengthens. An annular keeper 124B on the thumping body 112A, which is fitted into another annular follower of the innermost thumping hollow element 122B, facilitates the sliding of the innermost thumping hollow element 122B into the outermost thumping hollow element 122A when the thumping body 112A shortens into the set of thumping hollow elements 122A, 122B. In one embodiment, to conserve weight of the drone 100, a battery is suitably placed into the thumping body 112, from which D.C. voltage or current is provided to operate the drone 100.

The thumping body 112A finishes at its proximal end with a C-shaped thumping terminus 112B. The thumping body 112A is coupled to a thumping rod 130 of which the distal end finishes with a thumping stop 132. The thumping rod 130 facilitates the lengthening or shortening of the thumping body 112A depending on the motion of a second wheel 140B, which is in communication with a first wheel 140A via a timing belt 138. The first wheel 140A is actuated by a shaft 136 which is in communication with a vermiculate device 134. Stabilizing pieces of hardware include a motion fixture 126A, a projecting beam 128B, and a fixture 128A, all of which act to stabilize the thumping structure 112 when motion is generated to allow the thumping body 112A to thump the C-shaped thumping terminus 112B against an object of interest.

More specifically, the thumping rod 130 is caused to advance the thumping body 112A longitudinally so as to lengthen it or to withdraw the thumping body 112A and thereby shorten it vis-a-vis the friction engagement of a driving roller 142A and a corresponding driven roller 142B to the thumping rod 130. For example, to lengthen the thumping body 112A out of the body 104 or to shorten the thumping body 112A into the body 104, several pieces of hardware are provided including a motor 144; a pair of driving roller 142A and a corresponding driven roller 142B for lengthening/shortening the thumping rod 130; and a means for transferring a force from the motor 144 to the driving roller 142A and a corresponding driven roller 142B. The force transferring means includes the vermiculate device 134, a vermiculate gear 134A, and a pulley arrangement including first and second wheels 140A and 140B as well as the timing belt 138. The timing belt 138 is suitably constructed of rubber.

When the motor 144 rotates clockwise or counterclockwise about a first axis, the vermiculate device 134 rotates on the same axis. Then, the vermiculate gear 134A rotates in engagement with the vermiculate device 134. The vermiculate gear 134A rotates about a second axis; the first wheel 140A about the second axis spaced from the vermiculate gear 134A by the shaft 136. Then, a pulley arrangement comprising the first wheel 140A transfers a force to the second wheel 140B through the timing belt 138. Rotation of the second wheel 140B leads to rotation of the driving roller 142A about a third axis, while the driven roller 142B rotates about a fourth axis in contact with the driving roller 142A. That is, the force of the motor 144 is transferred to the driving roller 142A and the driven roller 142B, to thereby lengthen/shorten the thumping body 112A.

In one embodiment, the motor 144 is an imbalanced-mass motor, which when activated produces a thumping motion which is communicated to the thumping rod 130, which correspondingly communicates to the thumping body 112A, and ultimately to the C-shaped thumping terminus 112B. Vibrational sensors (not shown) receive low-frequency feedback from an object of interest, which has earlier been thumped by the thumping structure 112. The feedback is electronically stored for characterization of the object of interest, such as a roof, to determine its aging characteristics, among other things.

Figure 4:
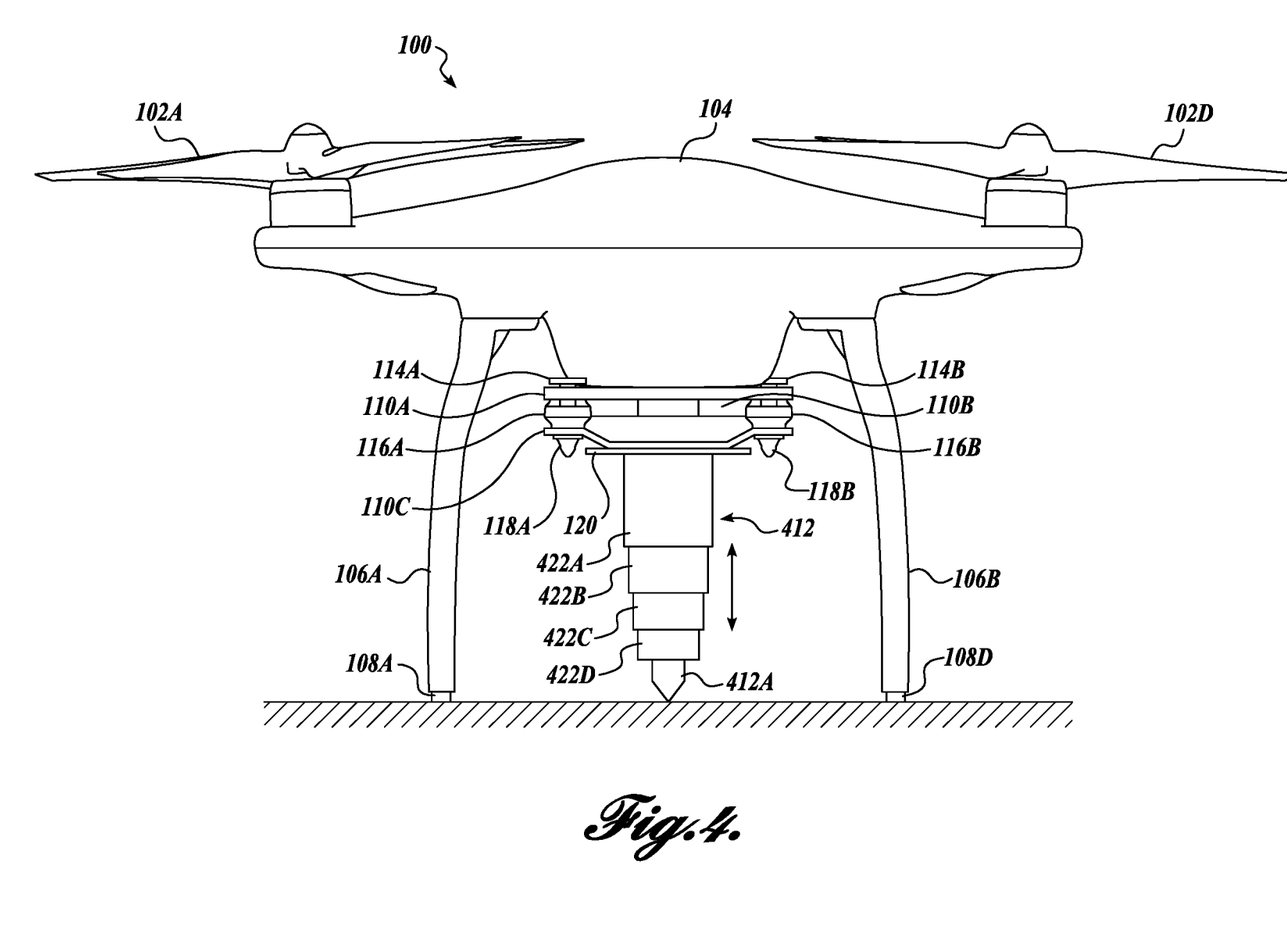
FIG. 4 is a planar diagram illustrating a front of another archetypical drone.

FIG. 4 illustrates an additional drone which contains elements similar to those previously discussed, and for brevity purposes they will not be presented again. FIG. 4 illustrates a thumping structure 412. The thumping structure 412 includes thumping hollow elements 422A-422D. Extending beyond the thumping hollow element 422D is a thumping terminus 412A, which ends in a chisel-like tip. The chisel-like tip facilitates drumming on an object of interest, from which feedback is received by the vibrational sensors for storage and later characterization.

Figure 5:
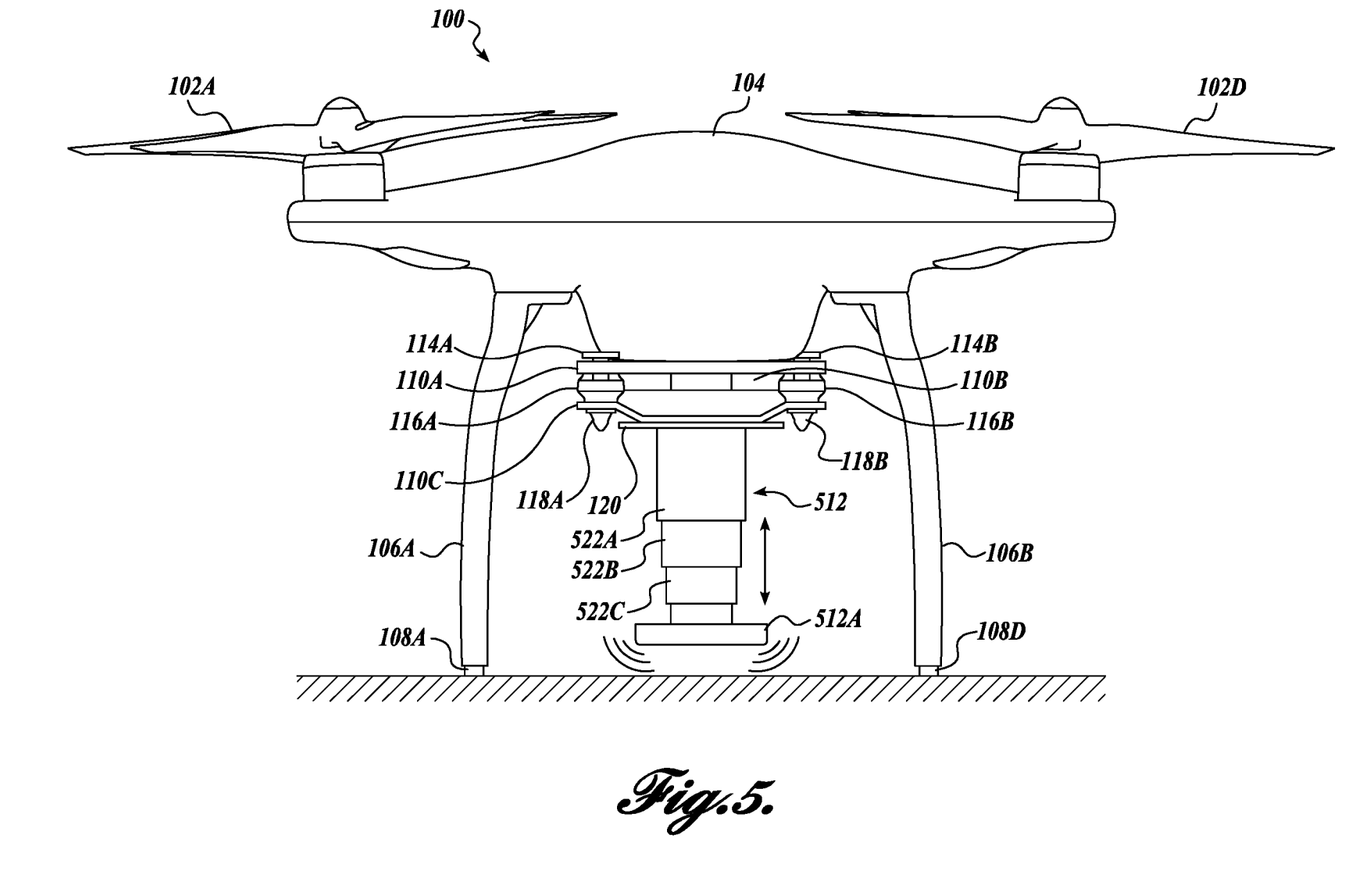
FIG. 5 is a planar diagram illustrating a front of a further archetypical drone.
Figure 6:
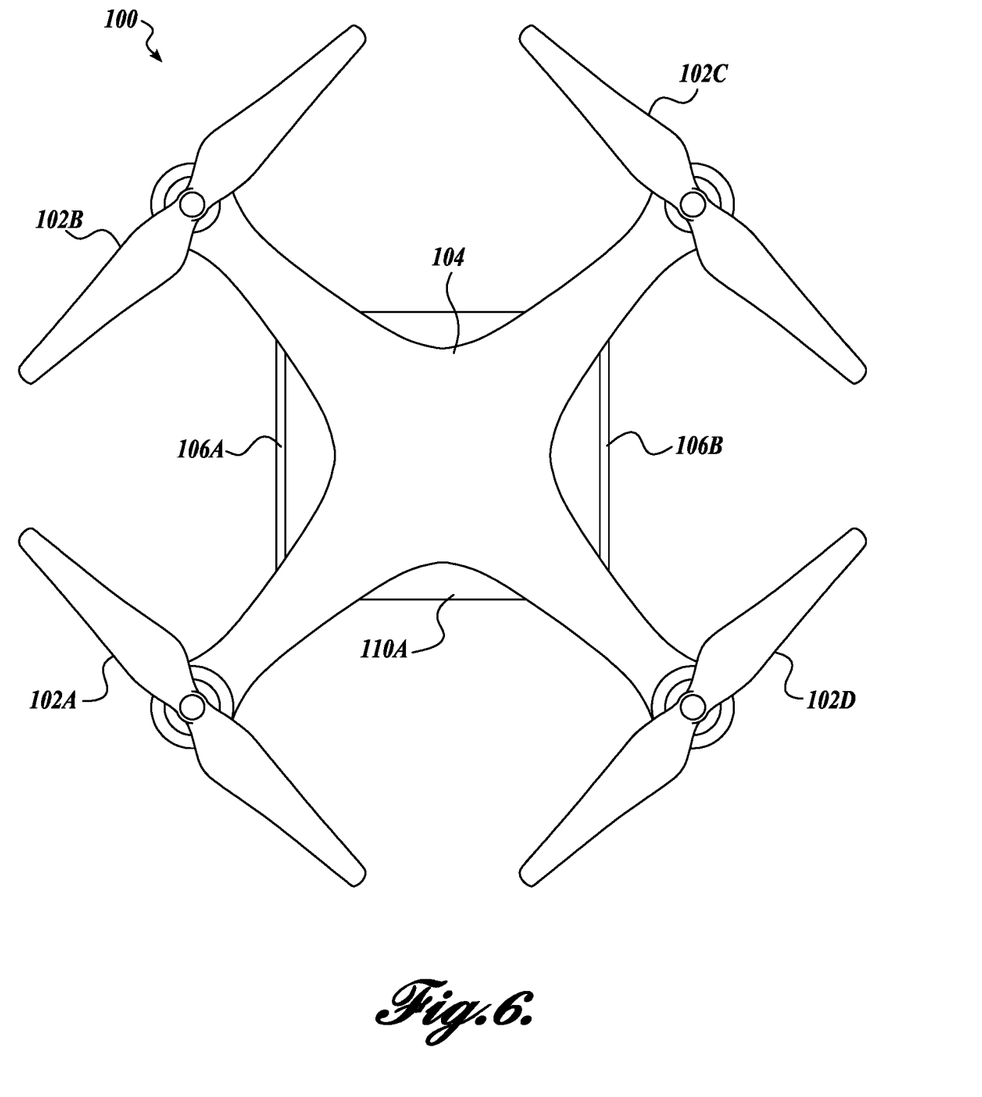
FIG. 6 is a planar diagram illustrating a top of an archetypical drone.
Figure 7:
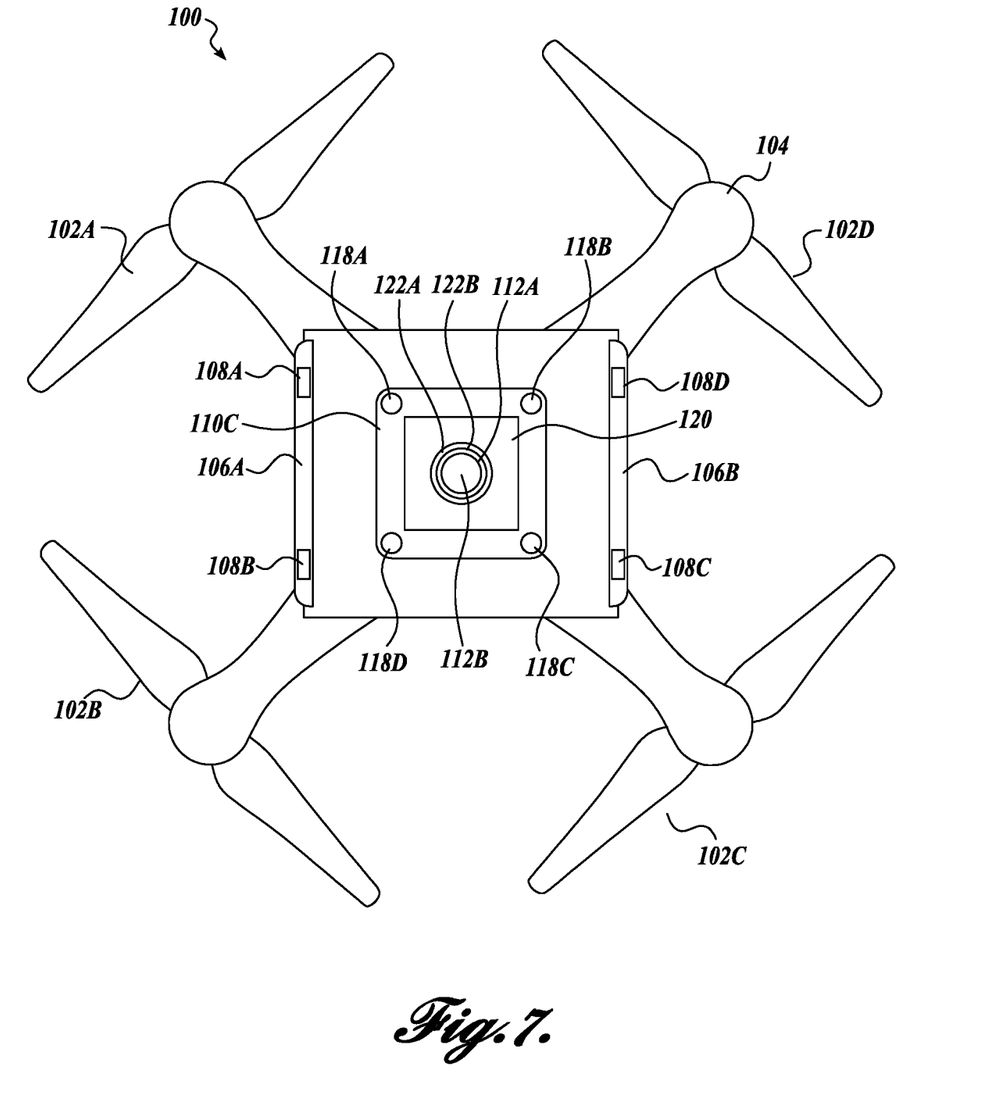
FIG. 7 is a planar diagram illustrating a bottom of an archetypical drone.

FIG. 5 illustrates another archetypical drone with elements similar to those elements previously discussed, and for brevity purposes, they will not again be presented. A slidable cylindrical structure 512 is illustrated in FIG. 5. Several slidable hollow elements 522A-522C are illustrated. Extending beyond the slidable hollow element 522C is a piezoelectric transducer 512A for generating an ultrasound wave. Sensors receive echoes of the generated ultrasound wave. Means of interpreting the received echoes are provided either on the drone or remotely at a computer server with which the drone is in communication.

The piezoelectric transducer 512A emanates a desired frequency of the ultrasound wave after the drone produces strong, short electrical pulses to drive the piezoelectric transducer 512A. The frequencies can be anywhere between 1 and 18 MHz. The piezoelectric transducer 512A may focus the beam of ultrasound waves with physical lenses in some embodiments. In other embodiments, the piezoelectric transducer 512A uses a phased array to facilitate a change in the direction and depth of focus of the ultrasound wave. Suitable materials on the face of the piezoelectric transducer 512A enable the ultrasound waves to be transmitted into the object of interest. One suitable material includes a rubbery coating for impedance matching to maximize the receipt of echoes so as to inhibit their attenuation. In addition, the drone may spray water-based foam or gel on the object of interest prior to emanating the ultrasound waves. The echoes of the ultrasound waves are partially reflected from the layers of the object of interest. Specifically, echoes are reflected anywhere where there are acoustic impedance changes in the object of interest including roof materials, nails, insulation, and so on.

One insurance application of the use of multimedia data obtained from drones with sensors includes assessment of perils in auto insurance claims. The drones with sensors may be used to access a traffic collision to assess property damage, bodily injury, and so on. They may be used to track and/or identify a stolen automobile so as to assess theft losses and so on. Another insurance application is the use of multimedia data obtained from drones with sensors to detect fraudulent claims in property damage, accident, sickness, and unemployment insurance. They can be used to verify the fitness of the claimant in disability insurance (short-term disability insurance or long-term disability insurance), total permanent disability insurance, or workers' compensation insurance. Another insurance application includes the use to monitor perils for casualty insurance, such as crime insurance, and political risk insurance (accessing locations where there is a risk of revolution or other negative political conditions resulting in a loss).

Suitably, various embodiments of the present subject matter focus on property insurance applications. The drones with sensors may be used to assess perils connected with fire, theft, or weather damage. They can be used to fly over a forest fire, track a stolen piece of property, survey roof damage, survey flood damage, and so on. They can be used to assess perils connected with earthquake insurance. Damage to an insured home can be studied using the drones with sensors. For those with inland marine insurance, the use of the drones with sensors can gather data without having to navigate the area waters of the insured. Perils connected with boiler insurance can also be observed and risk assessed (such as in a situation where an installed boiler explodes causing fire damage to the house housing the boiler and neighboring houses.)

Other property insurance applications include the use of drones with sensors to assess perils connected with aviation insurance, such as in inspections of aircraft hulls and spares, and in assisting determination of passenger and third-party liability. Other perils in this category include the use of drones with sensors to inspect perils connected with airports, such as air traffic control, refueling operations at international airports, and so on. Further property insurance applications include builder's risk insurance that allows perils connected with a construction site to be observed, including inspection of material fixtures, and equipment used in construction or renovation of a building or structure. One other property insurance application includes home insurance that uses drones with sensors to assess perils of damage or destruction of an insured's home. An additional property insurance application includes landlord insurance that allows inspection of perils connected with residential and commercial properties rented to residential renters or businesses.

One additional property insurance application includes the use of drones with sensors to observe perils connected with marine insurance and marine cargo insurance to observe losses or damage to vessels while at sea or in inland waterways. A further property insurance application includes the use of drones with sensors to observe perils connected with inland marine insurance. These drones with sensors can be deployed to monitor perils of goods in transit and property of others that is on someone's premise. The deployment could include waterways, but could encompass property on land. The deployment avoids the need to send a person to inspect the premise which may be extensive. Inland marine insurance conventionally indemnifies loss to movable or specialized types property, historically developing as an outgrowth of ocean marine insurance mentioned above. This category of insurance includes property coverage for construction equipment, medical diagnostic equipment, fine arts, solar panels and wind turbines, cameras and movie equipment, musical instruments, and a wide variety of other types of property. Inland marine insurance covers a wide range of property and materials, such as property in transit; property in the custody of a bailee; property deemed to be an instrumentality of transportation or communication, such as bridges and radio towers; mobile medical equipment; contractors equipment; and so on.

The use of drones with sensors may also assess perils connected with cargo in marine transit. A rare property insurance application includes the use of drones with sensors to assess perils connected with terrorism insurance, volcanic eruptions via volcano insurance, wind uncertainties (such as hurricanes, via windstorm insurance), bloodstock insurance to observe perils connected with horses, Defense Base Act insurance to inspect perils connected with civilian workers hired by the government to work in foreign countries, expatriate insurance, kidnap and ransom insurance, livestock insurance to observe perils (such as those connected with farms, aquariums, fish, and other animal holdings), nuclear incident insurance to inspect perils connected with radioactive materials, and pollution insurance to observe perils connected with contamination of air, water, or land due to accidental release of hazardous materials from an insured site. Other deployment of drones with sensors may also include assessing perils connected with insurance CAT claims; mining and metals; railroad; aviation; water management and water treatment; power and utilities; emergency services and civil protection; agriculture and forest services; and so on.

Various embodiments of the present subject matter are directed to gathering and storing data and images and transmitting the same in real time or near real time or at a later time via drones with sensors to networked computing systems/platforms for use in connection with the carrying on of the business of insurance and other insurance-related service businesses. Using drones with sensors, the system captures and streams motion video, still images, and other applicable data for the purpose of monitoring conditions continuously or from time to time or as otherwise necessary and making assessments or documenting facts and details of the condition of properties, vehicles, or facilities and surrounding areas and recording events impacting the same. Various embodiments of the present subject matter eliminate or reduce safety risks to claims adjusters, eliminate the need for expensive truck rentals and related multisite visits and scheduling delays, and provide fraud detection and loss prevention data. The present subject matter facilitates better assessment of risk and adjustment of claims in hard-to-reach or hard-to-assess locations, such as buildings, private properties, medical rooms, waters, space, and so on. The conventional use of satellite positioning to obtain data is unsatisfactory because of misaligned positioning and the weather, such as clouds, which can impede image acquisition for insurance applications.

This subject matter may be practiced at the beginning of an insurance or services relationship and may be used before, during, and after any event related to the target properties, vehicles, or facilities. In one embodiment, for example, data, images or a combination collected or recorded from the drones with sensors is transmitted to an insurance application for an initial assessment of conditions and such information can be used as a comparison after use of the subject matter to perform an inspection or assessment after an event or claim. This is only one example of the use of the subject matter and it will be capable of being used in nearly any situation where aerial surveillance and gathering of data is relevant to carrying on the business of insurance; in particular it is relevant to underwriting practices and claims practices that rely upon facts regarding the condition of the target at any point in time.

While illustrative embodiments have been illustrated and described, it will be appreciated that various changes can be made therein without departing from the spirit and scope of the invention.

The invention claimed is:

1. A method of operating a drone to collect sensor feedback data associated with an object, the method comprising:
   deploying, via a server, a drone to an object of interest by transmitting one or more control signals to a controller that is communicatively connected with the drone, the drone comprising at least one sensor in communication with the controller;
   operating, via the controller, the drone to position the drone adjacent the object of interest such that the drone interacts with the object;
   collecting sensor feedback data based at least in part on the interaction between the drone and the object, the sensor feedback data being collected through the at least one sensor;
   transmitting, over a network, the sensor feedback data to the controller;
   computing one or more observable parameters based on the transmitted sensor feedback data;
   detecting a geographic zone within which the drone is positioned; and
   causing, via instructions transmitted from the controller, the at least one sensor of the drone to turn off when the geographic zone is subject to one or more geographic restrictions.

2. The method of claim 1, further comprising the step of authenticating that the collected sensor feedback data relating to the object corresponds to a targeted object of interest.

3. The method of claim 1, further comprising the steps of:
   prior to collecting the sensor feedback data, transmitting, over the network, an indication of intent to interact with the object; and
   upon computing the one or more observable parameters, generating one or more drone fingerprints configured to provide a co-located chain of evidence for the collected sensor feedback data.

4. The method of claim 3, wherein:
   the controller comprises a memory and a microprocessor;
   the one or more drone fingerprints are stored in the memory of the drone; and
   the microprocessors is configured to compute the one or more observable parameters.

5. The method of claim 3, wherein:
   the controller is configured to communicate with a server; and
   one or more of the drone fingerprints, the observable parameters, or the collected sensor feedback data are periodically transmitted, by the controller, to the server.

6. The method of claim 3, wherein the drone fingerprint is selected from a group consisting of a 5-Digit Exemption Number, COA Number, FAA Tailfin Number, Operator/Pilot License Number, Airframe Make, Airframe Model, Airframe Serial Number, Flight Navigational System Make, Flight Navigational Model, Flight Navigational Version, Flight Navigation Firmware Version, Altitude, Speed, Heading, and Image Number Over Total Number of Images.

7. The method of claim 1, wherein the object of interest is one of: a parcel of land, a piece of personal property, or a facility.

8. The method of claim 1, wherein the one or more geographic restrictions are drone-use restrictions.

9. The method of claim 1, wherein the step of computing of the one or more observable parameters comprises the sub-steps of:
via the controller, either sensing or initiating hacking activities; and
based upon the sensed or initiated hacking activities, analyzing, via the controller, a cybersecurity risk of the object.

10. The method of claim 1, wherein the step of computing of the one or more observable parameters involves analyzing, via the controller, one or more structural characteristics of the object.

11. The method of claim 1, wherein:
the recited steps occur at a first point in time for an initial assessment of conditions associated with the object;
the recited steps are periodically repeated at least a second point in time, the second point in time being after the first point in time; and
the method further comprises the step of comparing, via the controller, the observable parameters computed at the second point in time with the observable parameters computed at the first point in time, so as to perform an inspection or assessment after an event occurring between the first and second points in time.

12. The method of claim 1, wherein:
the drone further comprises a thumping structure comprising:
a thumping body; and
a C-shaped thumping terminus located at the proximal end of the thumping body; and
the interaction between the drone and the object occurs via the thumping structure.

13. The method of claim 12, wherein the interaction between the drone and the object specifically comprises operating the drone such that the C-shaped thumping terminus physically contacts the object.

14. The method of claim 12, wherein the drone further comprises an insulator structure that interfaces with an interfaced layer, the interfaced layer acting as a supporting joint to the thumping structure so as to provide non-destructive interaction between the drone and the object.

15. The method of claim 12, wherein the thumping body emerges beyond the thumping structure, the thumping body lengthening from a thumping rod through a set of elongated, rigid thumping hollow elements which terminate at the proximal end of the thumping body in the C-shaped thumping terminus, the set of thumping hollow elements including an outermost thumping hollow element and an innermost thumping hollow element, the set of thumping hollow elements having aligned longitudinal axes and successively decreasing transverse dimensions to facilitate each of the thumping hollow elements to axially slide there-between and permitting the thumping body to pass through the inside of the set of thumping hollow elements.

16. The method of claim 15, wherein the thumping body is coupled to the thumping rod of which the distal end finishes with a thumping stop, the thumping rod facilitating the extending and contracting of the thumping body depending on the motion of a second wheel in communication with a first wheel via a timing belt.

17. The method of claim 1, wherein:
the drone further comprises:
a slidable cylindrical structure coupled to a bottom of the drone; and
a piezoelectric transducer positioned adjacent one end of the slidable cylindrical structure; and
the interaction between the drone and the object occurs via the piezoelectric transducer emanating ultrasound waves toward the object.

18. The method of claim 17, wherein:
the drone further comprises, emerging beyond the slidable cylindrical structure, a transducer body; and
the transducer body lengthens from a rod through a set of elongated, rigid, slidable hollow elements which terminate at its proximal end in the piezoelectric transducer, the set of slidable hollow elements including an outermost slidable hollow element and an innermost slidable hollow element, the set of slidable hollow elements having aligned longitudinal axes and successively decreasing transverse dimensions to facilitate each of the slidable hollow elements to axially slide there-between and permitting the transducer body to pass through the inside of the set of slidable hollow elements.

19. The method of claim 18, wherein the transducer body is coupled to the rod of which the distal end finishes with a stop, the rod facilitating the lengthening or shortening of the transducer body depending on the motion of a second wheel which is in communication with a first wheel via a timing belt, the first wheel being actuated by a shaft which is in communication with a vermiculate device.

* * * * *